(12) United States Patent
Lee

(10) Patent No.: US 6,766,340 B2
(45) Date of Patent: Jul. 20, 2004

(54) METHOD FOR FILTERING SIGNALS FROM NONLINEAR DYNAMICAL SYSTEMS

(75) Inventor: Chung-Yong Lee, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 229 days.

(21) Appl. No.: 10/154,747

(22) Filed: May 24, 2002

(65) Prior Publication Data

US 2002/0178193 A1 Nov. 28, 2002

Related U.S. Application Data

(62) Division of application No. 09/195,263, filed on Nov. 18, 1998, now Pat. No. 6,424,985.

(30) Foreign Application Priority Data

Nov. 18, 1997 (KR) .............................. 97-60886

(51) Int. Cl.[7] .............................................. G06F 17/10
(52) U.S. Cl. ....................................................... 708/322
(58) Field of Search .................................. 708/300, 301, 708/303, 304, 322, 323; 702/191, 194, 195

(56) References Cited

U.S. PATENT DOCUMENTS

| | | | | |
|---|---|---|---|---|
| 5,394,071 A | * | 2/1995 | Thoen | 318/610 |
| 5,521,851 A | * | 5/1996 | Wei et al. | 702/195 |
| 5,535,149 A | * | 7/1996 | Mori et al. | 708/322 |

* cited by examiner

Primary Examiner—Chuong Dinh Ngo
(74) Attorney, Agent, or Firm—F. Chau & Associates, LLC

(57) ABSTRACT

A method for filtering signals from a nonlinear dynamical system is provided. An initial enhanced point is set to a noisy point obtained from the signals. An intermediate enhanced point is estimated. A new enhanced point is calculated using the estimated point and a weighting constant. Estimation of an intermediate enhanced point and calculation of a new enhanced point are iterated until the computed point converges to a true enhanced point which represents a noise reduced signal to provide filtered signals, wherein the new enhanced point is computed by the equation $$\hat{x}_n^{(i)} = \hat{x}_n^{(i-1)} + K_3[\hat{x}_n^{(i,temp)} - \hat{x}_n^{(i-1)}]$$

wherein $\hat{x}_n^{(i)}$ is the new enhanced point, $\hat{x}_n^{(i-temp)}$ is the intermediate enhanced point for iteration i, $\hat{x}_n^{(i-1)}$ is the enhanced point at iteration i-1, and $K_3$ is a weighing constant.

4 Claims, 6 Drawing Sheets

METHOD FOR FILTERING SIGNALS FROM NONLINEAR DYNAMICAL SYSTEMS

This is a divisional application of co-pending U.S. application Ser. No. 09/195,263 filed on Nov. 18, 1998. Now U.S. Pat. No. 6,424,985.

FIELD OF THE INVENTION

The present invention relates to nonlinear dynamical systems, more particularly, to a system and method for filtering signals from a nonlinear dynamical system.

BACKGROUND OF THE INVENTION

A deterministic signal from a nonlinear system may look like noise when displayed in either a time or frequency domain. Numerous work in this field involved a search for applications of these "noise-like" deterministic signals. Cuomo and Oppenheim have applied a chaotic system with self-synchronization property to the secure communications problem (K. M Cuomo and A. V. Oppenheim, "Chaotic Signals and Systems for Communications", IEEE Proceedings of International Conference on Acoustics, Speech, and Signal Processing, vol. 3, pp. 137–140, 1993). In their implementation, if a level of additive noise due to a transmitting channel exceeds 10% of the driving signal, synchronization will not occur. Therefore, for their algorithm to succeed at low signal-to-noise ratios (SNRs), a noise reduction algorithm is necessary.

Unfortunately, conventional linear filtering methods cannot be applied successfully to signals produced by chaotic systems, because the signals have, generally, broad-band spectra. Among the existing noise reduction methods, a method described in the article by J. D. Farmer and J. J. Sidorwich, "Optimal Shadowing and Noise Reduction", Physical D 47, pp. 373–392, 1991 ("Farmer's method") exhibits good performance in mild SNR circumstances. The Farmer's method assumes the system dynamics are known. However, the structure of the Farmer's method is relatively complicated because it combines the manifold decomposition procedure and singular value decomposition for the inversion of a large rank deficient matrix.

SUMMARY OF THE INVENTION

It is therefore an object of the present invention to provide generalized iterative noise reduction methods and systems for contaminated chaotic signals which are simple and easily implemented.

To attain the above object, according to an aspect of the present invention, there is provided a method and system for filtering signals from a nonlinear dynamical system, comprising the steps of: (a) setting an initial enhanced point to a noisy point; (b) estimating a deviation term; (c) weighting the estimated deviation term; (d) computing a new enhanced point; and (e) iterating the steps (b) to (d) until the computed point converges to a true enhanced point.

According to another aspect of this invention, there is provided a method and system for filtering signals from a nonlinear dynamical system, comprising the steps of: (a) setting an initial enhanced point to a noisy point; (b) estimating an intermediate enhanced point; (c) computing a new enhanced point using the estimated point and weighting constants; and (d) iterating the steps (b) and (c ) until the computed point converges to a true enhanced point.

A system for filtering signals from a nonlinear dynamical system, includes means for setting an initial enhanced point to a noisy point of an input signal, means for estimating a deviation term, means for weighting the estimated deviation term and means for computing a new enhanced point wherein the means for computing iterates until the computed point converges to a true enhanced point.

Another system for filtering signals from a nonlinear dynamical system includes means for setting an initial enhanced point to a noisy point, means for estimating an intermediate enhanced point and means for computing a new enhanced point using the estimated point and a weighting constant, the computing means for iterating until the computed point converges to a true enhanced point.

These and other objects, features and advantages of the present invention will become apparent from the following detailed description of illustrative embodiments thereof, which is to be read in connection with the accompanying drawings.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings, wherein.

DESCRIPTION OF PREFERRED EMBODIMENTS

A noise removal process will be considered as a constrained optimization problem. Consequently, when a function $C_1(\hat{x},y)$ to be minimized with respect to $\hat{x}_n$ under constraints $C_2(\hat{x})=0$ is obtained, a constrained cost function C can be defined using a weight function $\Gamma$:

$$C=C_1(\hat{x},y)+\Gamma C_2(\hat{x}) \quad (1)$$

The function $C_1(.,.)$ should measure the closeness between the enhanced points $\hat{x}_n$ and the noise points $y_n$. The Euclidean distance between $\hat{x}_n$ and $y_n$ is an example of an acceptable $C_1(.,.)$. Alternatively, the correlation between $\hat{x}_n$ and $y_n$ is also a suitable choice for a $C_1(.,.)$, but it must be maximized instead of minimized. There exist many other candidates for $C_1(.,.)$.

The constraint function $C_2(.)$ should be chosen to enforce the dynamics of the system. For example, if $f(.)$ and $f^{-1}(.)$ indicate the forward dynamics and the backward (inverse) dynamics, respectively, $$C_2(\hat{x}) = \sum_{n=L_2}^{N-L_1-1} \left[ \sum_{k=1}^{L_1} \|f^k(\hat{x}_n) - \hat{x}_{n+k}\|^2 + \sum_{k=1}^{L_2} \|f^{-k}(\hat{x}_n) - \hat{x}_{n-k}\|^2 \right] \quad (2)$$

is one possible choice of $C_2(.)$ for some positive integers $L_1$ and $L_2$, where $f^k(.)$ and $f^{-k}(.)$ indicate the $k^{th}$-fold composition of the forward dynamics $f(.)$ and the backward dynamics $f^{-1}(.)$, respectively, and N is the number of available data points. If $f^{-1}(.)$ does not exist, the second term of equation (2) can be ignored.

$$\frac{\delta C}{\delta \hat{x}} = \frac{\delta C_1(\hat{x}, y)}{\delta \hat{x}} + \Gamma \frac{\delta C_2(\hat{x})}{\delta \hat{x}_n} = 0 \quad (3)$$

Given $C_1(.,.)$ and $C_2(.)$, it is possible to find a solution by taking the derivatives of C with respect to $\hat{x}_n$ and $\Gamma$, and setting them equal to zero.

$$\frac{\delta C}{\delta \Gamma} = C_2, (\hat{x}) = 0 \quad (4)$$

It is possible to find $\hat{x}_n$ satisfying both equations (3) and (4). In most cases, it is not easy to get a closed form solution because of the nonlinear terms in equations (3) and (4). However, it is possible to estimate the deviation (i.e., noise) term or the solution iteratively.

According to an illustrative embodiment of the present invention, an "iterative method" for solving the linear system Ax=b is used. When the amount of computation in solving Ax−b=0 is excessive, choosing to settle for an approximation of $\hat{x}$ is possible and can be obtained more quickly. An iterative method is developed for any initial point, an improved solution $\hat{x}^{(i)}$ is produced at the i-th iteration from the previous iteration's solution, $\hat{x}^{(i-1)}$ that converges to x as the number of iterations increases. If assuming a matrix A is split and if $A=A_1-A_2$, then the equation Ax−b=0 becomes $A_1 x-A_2 x-b=0$. Therefore, the iterative scheme for a solution can be obtained:

$$A_1 \hat{x}^{(i)} = A_2 \hat{x}^{(i-1)} + b \quad (5)$$

This method requires that $A_1$ be a matrix which is relatively easy to invert, such as a diagonal or triangular matrix. Also, the iterative method (5) converges for any starting point if and only if the magnitude of every eigenvalue of $A_1^{-1} A_2$ is less than 1.

Embodiment I

This iterative approach is applied to solving the nonlinear system of the equations given in (3) and (4). When choosing suitable functions $C_2(\hat{x})$ and $C_1(\hat{x},y)$ and constant $\Gamma$, the equation is able to be arranged in the following form $$\hat{x}_n - y_n + h(\hat{x}, y) = 0 \quad (6)$$

for some nonlinear function $h(.,.)$. Since $y_n = x_n + w_n$, under the assumption $\hat{x}_n \approx x_n$, the equation (6) gives $$\hat{w}_n \approx h(\hat{x}, y) \quad (7)$$

Although $h(\hat{x},y)$ may contain $\hat{w}_n$ terms as nonlinear components, it can be assumed that $\hat{w}_n$ the equation (7) is an estimate of $w_n$, since $w_n$ should satisfy equation (7) as long as $\hat{x}_n$ is close to $x_n$. Therefore, in the spirit of the equation (5) for linear systems, it is possible to estimate the noise (deviation) component using the equation (7), and an enhanced point can be computed iteratively by setting $\hat{x}_n^{(i)} = \hat{x}_n^{(i-1)} - \hat{w}_n$ until the solution converges.

$$\begin{aligned}\hat{w}_n &\approx K_1 \hat{w}_n \quad \text{with } K_1 = 1 \quad \text{if } \|\hat{w}_n\| \leq \delta \\ & K_1 \hat{w}_n \quad \text{with } 0 < K_1 \ll 1 \quad \text{if } \|\hat{w}_n\| > \delta \end{aligned} \quad (8)$$

Clearly, $\hat{w}_n$ may not be a good estimate for the first several iterations, especially, when the SNR is very low. In those situations the terms in $\delta C_2(\hat{x})/\delta \hat{x}_n$ associated with the dynamical inconsistency of the noisy points may produce an unacceptably large correction term $\hat{w}_n$ causing the solution $\hat{x}_n$ to diverge. This behavior may be overcome by weighting the correction term $\hat{w}_n$ with a constant $K_1$ according to a threshold $\delta$.

If zero-mean white Gaussian noise and an M-dimensional dynamical system are assumed, then $\|\hat{w}_n\|^2$ possesses a $x^2$ distribution with M degrees of freedom. Hence with a probability density of $\|\hat{w}_n\|^2$, a suitable delta may be found. So, to estimate the enhanced data, each point in a manner analogous to equation (5) is updated $$\hat{x}_n^{(i)} = K_2 \hat{x}_n^{(i,temp)} + (1 - K_2) \hat{x}_n^{(i-1)} \quad (9)$$
$$= \hat{x}_n^{(i-1)} - K_1 K_2 \hat{w}_n^{(i)}$$

$$\hat{x}_n^{(i,temp)} = \hat{x}_n^{(i-1)} + K_1 \hat{x}_n^{(i)} \quad (10)$$
$$\hat{w}_n^{(i)} = h(\hat{x}_n^{(i-1)}, y)$$

for a weighting constant $0 < K_2 \ll 1$. In these equations $\hat{x}^{(i)}$ and $\hat{x}^{(i-1)}$ are the enhanced points at the present i-th iteration and at the previous (i−1)-th iteration, respectively, as before. $\hat{x}^{(i,temp)}$ is an intermediate enhanced point at the present i-th iteration using $h(.,.)$. Since $K_2$ is related to both the convergence speed and stability, it is efficient to set $K_2$ to a relatively small value for the first several iterations to guarantee stable convergence and then to use a relatively large value for later iterations to achieve faster convergence.

Figure 1:
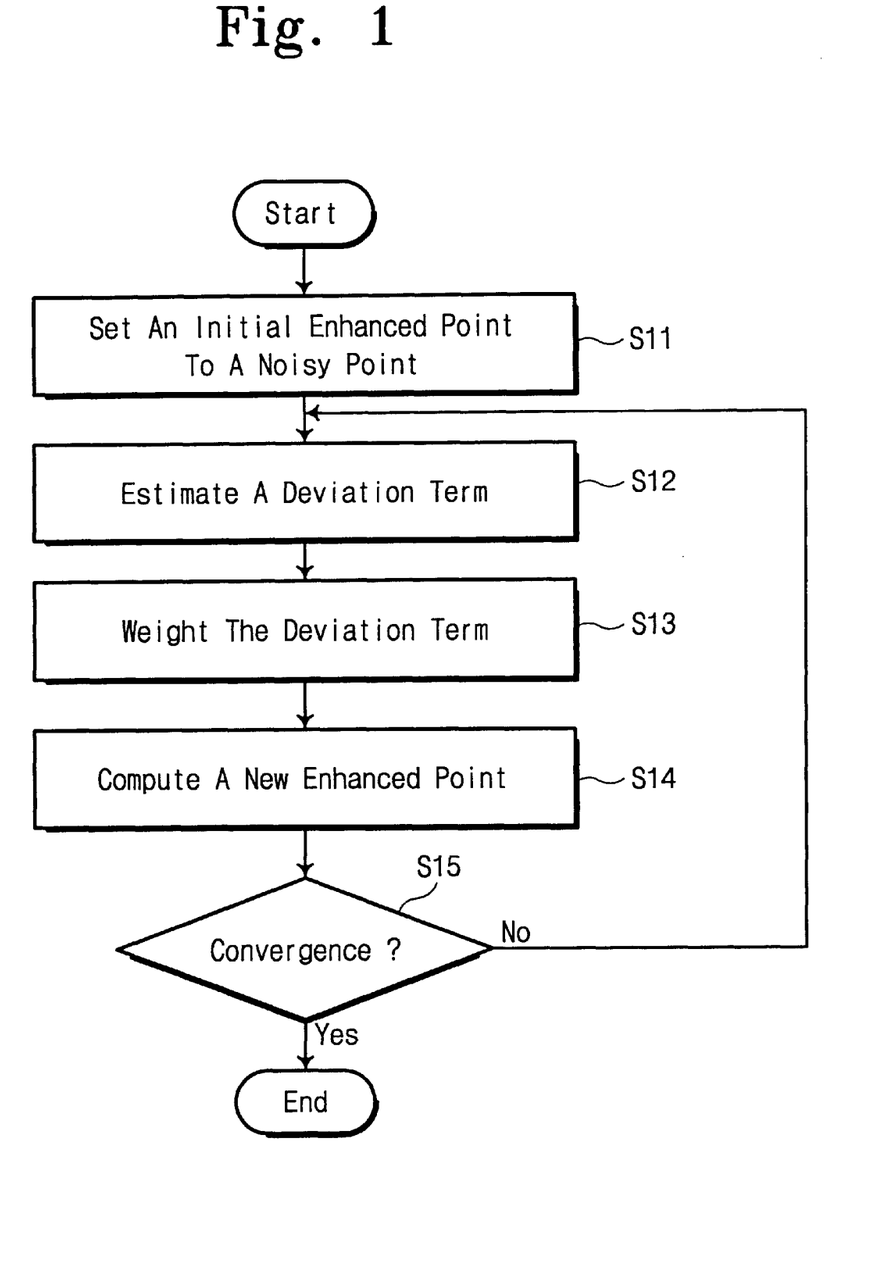
FIG. 1 is a flow diagram illustrating a filtering method according to the present invention.

The iterative update method will be described with reference to FIG. 1. Referring to FIG. 1, in step S11, an initial enhanced point $\hat{x}^{(0)}$ is set to a noisy point $y_n$. Flow proceeds to step S12 wherein the deviation term $\hat{w}_n$ is estimated using the equation (10). In step S13, the estimated deviation $\hat{w}_n$ is weighted to avoid unacceptably large corrections using the equation (8). In step S14, a new enhanced point $\hat{x}^{(i)}$ is computed using the equation (9). Then, flow advances to step S15 wherein the steps S12 to S14 are iterated until the computed point $\hat{x}^{(i)}$ converges to the true enhanced point $\hat{x}_n$.

Figure 5:
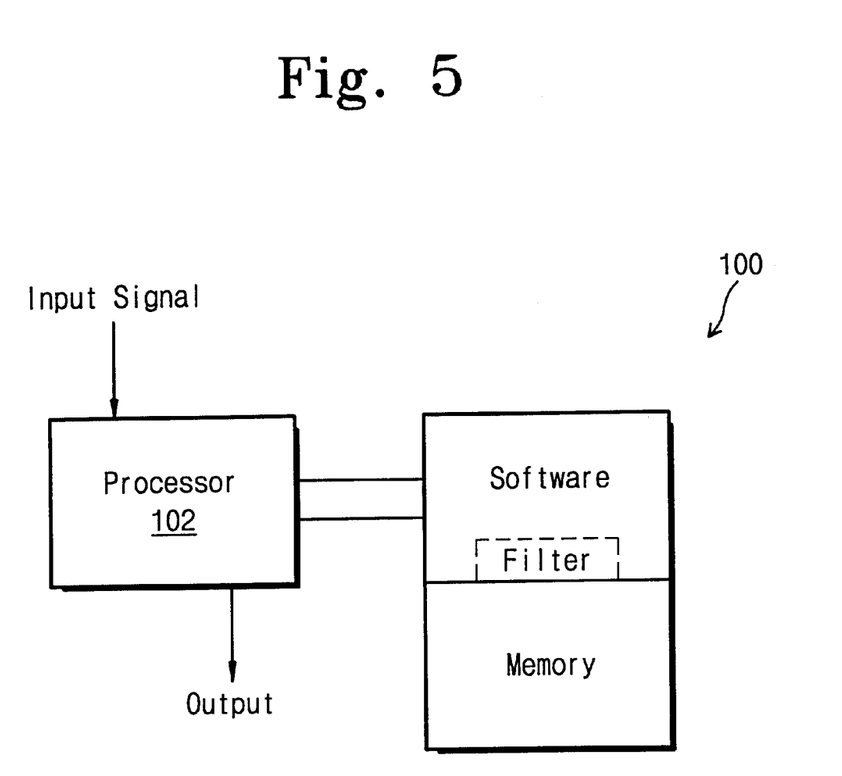
FIG. 5 is a block diagram of a filtering system in accordance with the present invention.

Referring to FIG. 5, a system 100 is shown for filtering signals from nonlinear dynamical systems in accordance with the present invention. System 100 is preferably implemented in various forms of hardware, software or combinations thereof. Preferably, these elements are implemented in software on one or more appropriately programmed general purpose digital computers having a processor and memory and input/output interfaces. An input signal is introduced to system 100 for filtering noise therefrom. An initial enhanced point $\hat{x}^{(0)}$ is set to a noisy point $y_n$ in accordance with a software implementation of the present invention. The deviation term $\hat{w}_n$ is estimated by processor 102 using the equation (10). The estimated deviation $\hat{w}_n$ is weighted by processor 102 to avoid unacceptably large corrections using the equation (8) as described above. A new enhanced point $\hat{x}^{(i)}$ is computed by processor 102 using the equation (9). Then, processor 102 iterates until the computed point $\hat{x}^{(i)}$ converges to the true enhanced point $\hat{x}_n$. The true enhanced point is output to provide a noise reduced signal in accordance with the present invention.

As described above, in this embodiment, the deviation of the observed signal from the nearest noise-free signal is estimated and the result to get a noise-reduced signal is used. To calculate the deviation, a cost function is minimized. The cost function is composed of two parts: one including information that represents how close the enhanced signals are to the observed signal and other including constraints that fit the dynamics of the system.

Embodiment II

In the earlier embodiment, suitable values are found for two weighting constants $K_1$ and $K_2$. According to another embodiment of the present invention, the enhanced signal $\hat{x}_n$ is estimated instead of the deviation term. For some nonlinear function $g(.,.)$, the equation (3) can be arranged with respect to $\hat{x}_n$ including the "linear" term, as follows.

$$\hat{x}_n = g(\hat{x}, y) \quad (11)$$

Since the equation (11) must be satisfied whenever the enhanced point $\hat{x}_n$ converges to the true point $\hat{x}_n$, the enhanced point of the present iteration $\hat{x}_n^{(i)}$ can be estimated by using $g(\hat{x}_n^{(i-1)}, y)$. This result is based on the same concept as that behind equation (5). A point can be updated using $$\hat{x}_n^{(i)} = K_3 \hat{x}_n^{(i,temp)} + (1 - K_3)\hat{x}_n^{(i-1)} \quad (12)$$
$$= \hat{x}_n^{(i-1)} + K_3[\hat{x}_n^{(i,temp)} - \hat{x}_n^{(i-1)}]$$

$$\hat{x}_n^{(i,temp)} = g(\hat{x}^{(i-1)}, y) \quad (13)$$

for a weighting constant $0 < K_3 \ll 1$. If equation (3) is rearranged with respect to the x; to include both linear and nonlinear terms, this embodiment would tend to be unstable, since the nonlinear terms, in general, are very sensitive to noise and may make this iteration diverge. In view of the suggestion in the previous embodiment that the matrix $A_1$ should be a simple matrix, the use of "linear" terms facilitate arrival at equation (11). The following investigations of this embodiment via numeral simulations show that this condition results in stable convergence.

Figure 2:
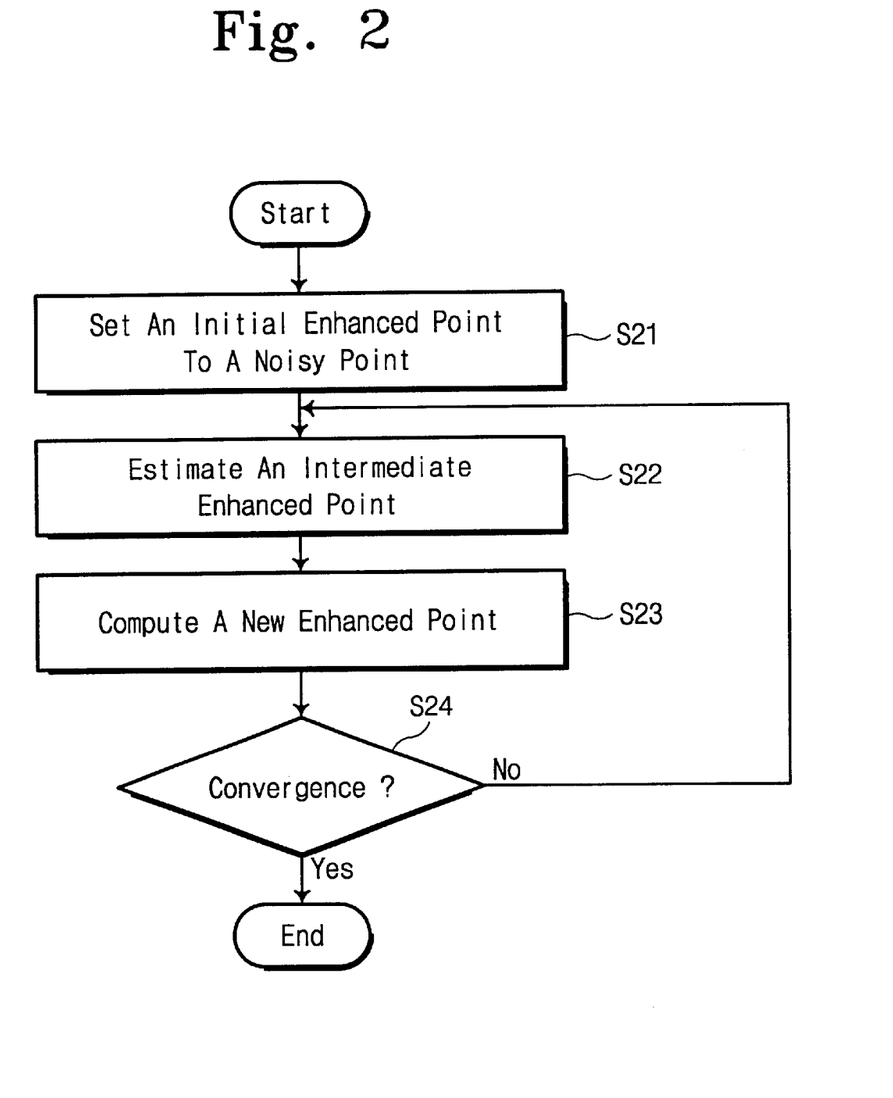
FIG. 2 is a flow diagram illustrating another filtering method according to the present invention.

The iterative update method will be described with reference to FIG. 2. Referring to FIG. 2, in step S21, an initial enhanced point $\hat{x}^{(0)}$ is set to a noisy point $y_n$. Flow proceeds to step S22 wherein an intermediate enhanced point $\hat{x}_n^{(i,temp)}$ is estimated using the equation (13). Thereafter, in step S23, a new enhanced point $\hat{x}^{(i)}$ is computed using the equation (12). Flow then continues to step S24 wherein the steps S22 to S23 are iterated until the computed point $\hat{x}^{(i)}$ converges to the true enhanced point $\hat{x}_n$.

Referring again to FIG. 5, a system 100 for filtering signals from nonlinear dynamical systems will be described for the second embodiment. System 100 is preferably implemented in various forms of hardware, software or combinations thereof. Preferably, these elements are implemented in software on one or more appropriately programmed general purpose digital computers having a processor, stored program having a filter module, memory and input/output interfaces. An input signal is introduced to system 100 for filtering noise therefrom. An initial enhanced point $\hat{x}^{(0)}$ is set to a noisy point $y_n$ by a processor 102. An intermediate enhanced point $\hat{x}_n^{(i,temp)}$ is estimated by processor 102 using the equation (13). Thereafter, a new enhanced point $\hat{x}^{(i)}$ is computed by processor 102 using the equation (12). Processor 102 iterates until the computed point $\hat{x}^{(i)}$ converges to the true enhanced point $\hat{x}_n$. The true enhanced point is output to provide a noise reduced signal in accordance with the present invention.

As described above, according to this embodiment, the observed signal is enhanced by iteratively seeking the signal minimizing a cost function.

Numerical Experiment

For the noise reduction problem, the performance of the illustrative noise reduction methods I and II according to the first and second embodiments of the present invention is compared with that of the conventional Farmer's method for white Gaussian noise. The sensitivity of the proposed noise reduction methods to the homoclinic tangency problem is investigated. The performance is discussed from two viewpoints: that of the true error and that of the dynamical error. The true error is defined as the difference between the noise free-point $x_n$ and the enhanced point $\hat{x}_n$:

$$e_{1,n} = \hat{x}_n - x_n$$

The dynamical error is defined as the inconsistency of the dynamics of the enhanced data $\hat{x}_n$:

$$e_{2,n} = \hat{x}_n - f(\hat{x}_{n-1})$$

In this section, noise reduction results are presented for a two-dimensional Henon map which is governed by $$x_{1,n+1} = 1 - 1.4 x_{1,n}^2 + x_{2,n}$$

$$x_{2,n+1} = 0.3 x_{1,n}$$

Figure 3A:
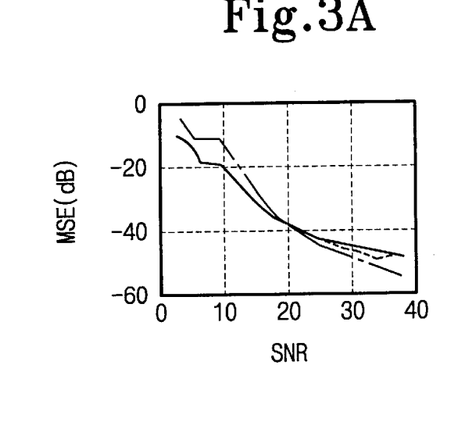
FIGS. 3a to 3d are diagrams illustrating the mean squared errors for Farmer's method and the filtering methods of FIGS. 1 and 2 for a Henon map according to various SNRs.
Figure 3B:
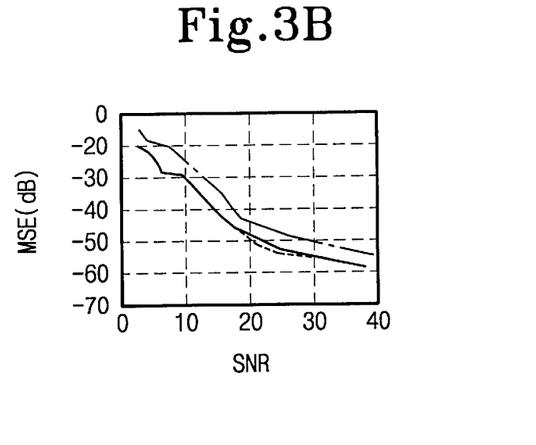
Figure 3C:
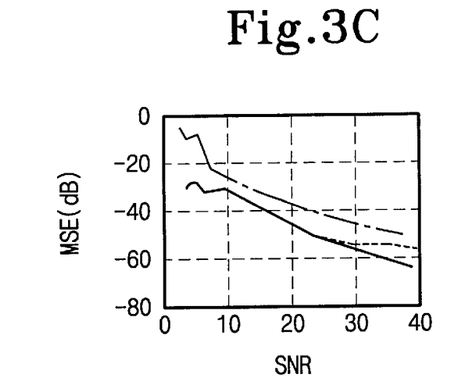
Figure 3D:
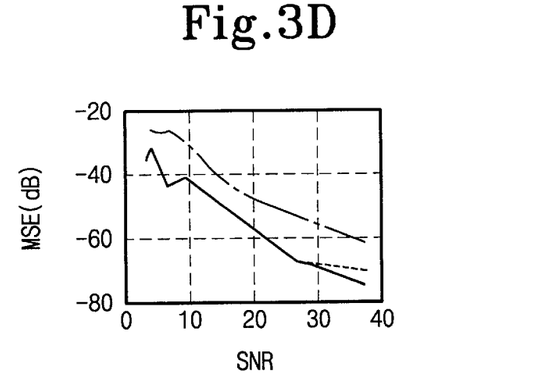

FIGS. 3a to 3d show a mean squared error (MSE) for each coordinate of the true error and the dynamical error according to various SNRs after the conventional Farmer's method (dash-dotted), the method I (dashed), and the method II (solid) are applied to a noisy two-dimensional Henon map. FIG. 3a depicts the true error for the first coordinate. FIG. 3b depicts the true error for the second coordinate. FIG. 3c depicts the dynamical error for the first coordinate. FIG. 3d depicts the dynamical error for the second coordinate.

In two embodiments of this invention, the following cost functions were used.

$$c_1(\hat{x}, y) = 1 - \frac{\sum_n \hat{x}_n^T y_n}{\sqrt{\sum_n \|\hat{x}_n\|^2} \sqrt{\sum_n \|\hat{y}_n\|^2}}$$

$$c_2(\hat{x}) = \sum_n \|f(\hat{x}_n) - \hat{x}_{n+1}\|^2$$

The method I was iterated for 200 times with $K_1 = 0.06667$ and $K_2 = 0.003$, while the method II was iterated for 200 times with $K_3 = 0.08$. Farmer's method was iterated for 20 times. The corrupting noise was additive white Gaussian noise. It can be seen from FIGS. 3a to 3d that methods I and II perform better than Farmer's method in connection with both the true error and the dynamical error. Advantageously, the method II is more efficient or convenient since it requires only one weighting constant $K_3$. Also, methods I and II require fewer computations than the Farmer's method and the structure of methods I and II is much simpler because it does not require the matrix inversion or the singular value decomposition calculation required by the Farmer's method. From this result, it can be understood that the illustrative methods according to the present invention have superior performance at relatively low SNRs than the Farmer's method.

Figure 4A:
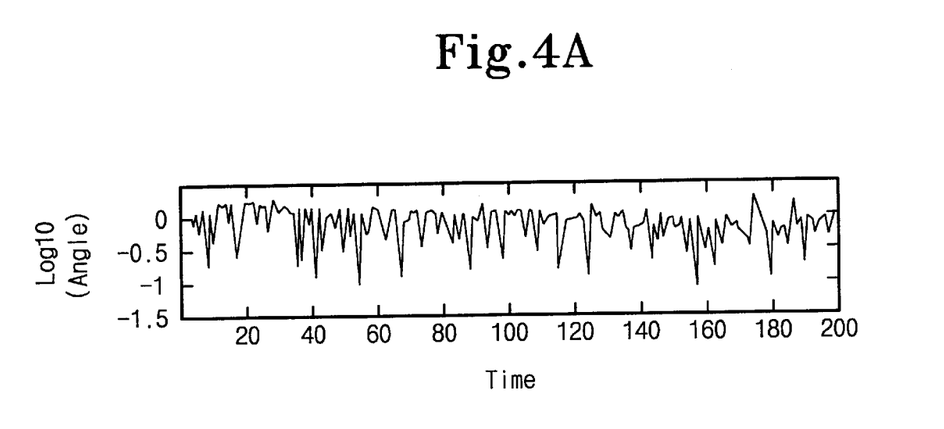
FIGS. 4a to 4e are diagrams illustrating the sensitivity of Farmer's method and the filtering method of FIG. 1 to the homoclinic tangency problem.
Figure 4B:
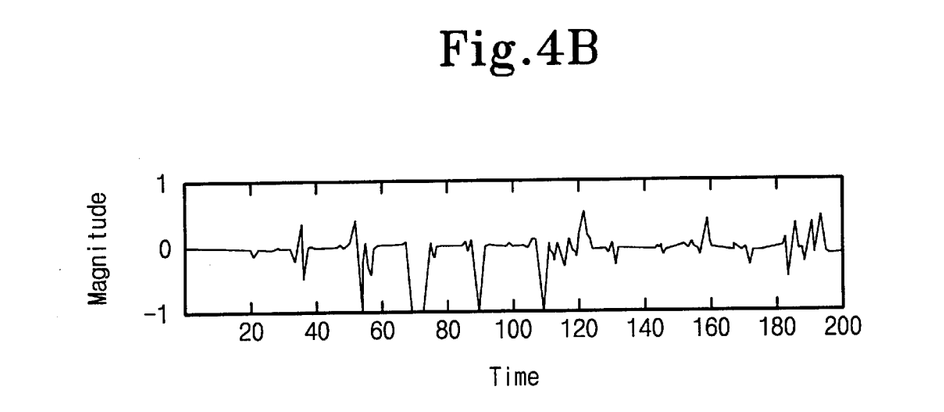
Figure 4C:
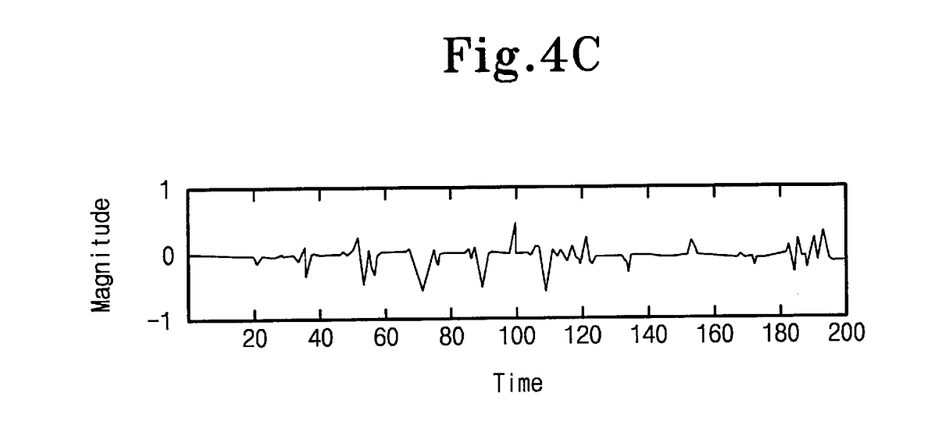
Figure 4D:
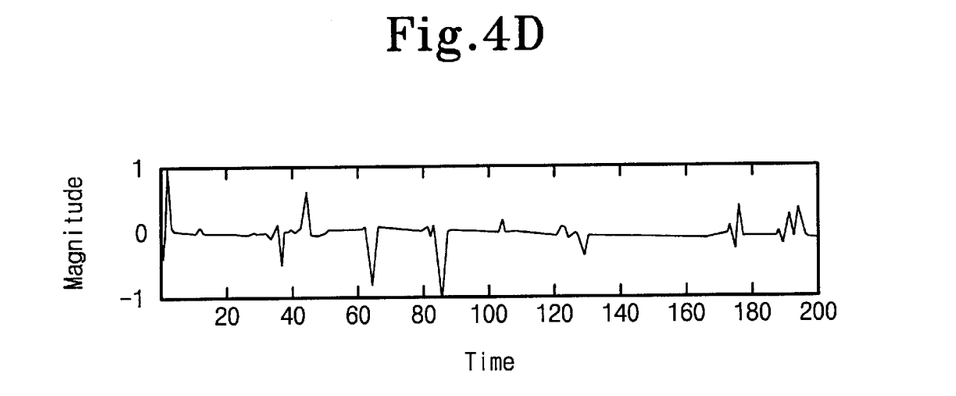
Figure 4E:
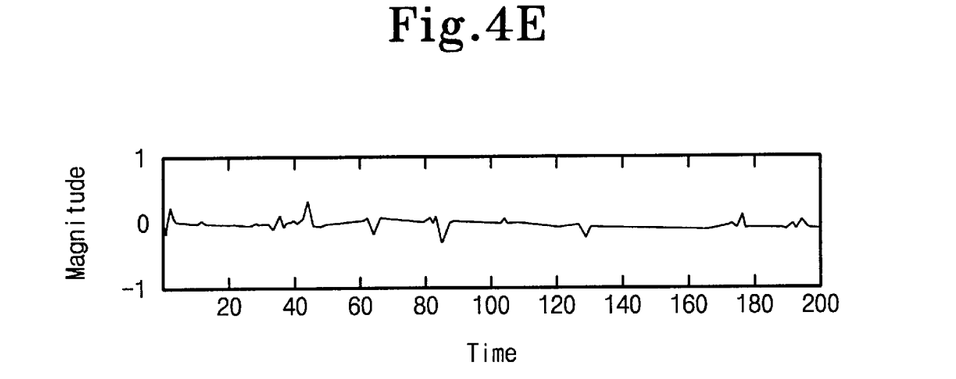

FIGS. 4a to 4e compare the sensitivity of the method I according to the present invention to the homoclinic tangency problem with that of the Farmer's method. The Farmer's method and the method I were supplied to the noisy two-dimensional Henon signal with a SNR of 8 dB. FIG. 4a depicts the logarithm of the estimated angle between the stable and unstable directions at each point. Therefore, the instances with small values indicate where the stable direction and the unstable direction are nearly parallel, i.e., homoclinic tangency points. FIGS. 4b and 4c show the first and second coordinates of the true error after applying the Farmer's method, respectively. In FIGS. 4d and 4e, the first and second coordinates of the true error after applying the method I are shown. Clearly, it can be understood that the method I is less sensitive to the homoclinic tangency problem than the Farmer's method.

As described above, according to this invention, noise reduction schemes for contaminated chaotic signals which are simple and easily implemented can be obtained.

The embodiments described herein are merely illustrative of the preferred embodiments and of the principles of the present invention. Various modifications may be made to the invention by those persons ordinarily skilled in the art, without departing from the true scope or spirit of the present invention. In addition, many modifications may be made to adapt a particular situation to the teaching of the present invention without departing from the central scope thereof. Therefore, it is not intended that the present invention be limited to the particular embodiment disclosed as the best mode contemplated for carrying out the present invention, but rather that the present invention includes all embodiments falling within the scope of the appended claims.

What is claimed is:

1. A method for filtering signals from a nonlinear dynamical system, comprising the steps of:
   (a) setting an initial enhanced point to a noisy point obtained from the signals;
   (b) estimating an intermediate enhanced point;
   (c) computing a new enhanced point using the estimated point and a weighting constant; and
   (d) iterating the steps (b) and (c) until the computed point converges to a true enhanced point which represents a noise reduced signal to provide filtered signals,
   wherein the new enhanced point is computed by the equation $$\hat{x}_n^{(i)} = \hat{x}_n^{(i-1)} + K_3 [\hat{x}_n^{(i,temp)} - \hat{x}_n^{(i-1)}]$$

wherein $\hat{x}_n^{(i)}$ is the new enhanced point, $\hat{x}_n^{(i-temp)}$ is the intermediate enhanced point for iteration i, $\hat{x}_n^{(i-1)}$ is the enhanced point at iteration i−1, and $K_3$ is a weighing constant.

2. The method for filtering signals from a nonlinear dynamical system as recited in claim 1, wherein the step of estimating the intermediate enhanced point includes the step of estimating an intermediate enhanced point in accordance with $$\hat{x}_n^{(i,temp)} = g(\hat{x}^{(i-1)}, y_n)$$

wherein signal $\hat{x}_n^{(i-temp)}$ is the intermediate enhanced point for iteration i, g is a non-linear function, $\hat{x}_n^{(i-1)}$ is the enchanced point at iteration i−1 for point n, and $y_n$ is a noise point at point n.

3. A system for filtering signals from a nonlinear dynamical system, comprising:
   a processor having an associated stored program including means for setting an initial enhanced point to a noisy point obtained from the signals;
   means for estimating an intermediate enhanced point; and
   means for iteratively computing a new enhanced point using the estimated point and a weighting constant until the computed point converges to a true enhanced point which represents a noise reduced signal to provide filtered signals,
   wherein the new enhanced point is computed by the equation $$\hat{x}_n^{(i)} = \hat{x}_n^{(i-1)} + K_3 [\hat{x}_n^{(i,temp)} - \hat{x}_n^{(i-1)}]$$

wherein $\hat{x}_n^{(i)}$ is the new enhanced point, $\hat{x}_n^{(i-temp)}$ is the intermediate enhanced point for iteration i, $\hat{x}_n^{(i-1)}$ is the enhanced point at iteration i−1, and $K_3$ is a weighing constant.

4. The system as recited in claim 3, wherein the means for estimating the intermediate enhanced point includes an intermediate enhanced point computed in accordance with $$\hat{x}_n^{(i,temp)} = g(\hat{x}^{(i-1)}, y_n)$$

wherein signal $\hat{x}_n^{(i-temp)}$ is the intermediate enhanced point for iteration i, g is a non-linear function, $\hat{x}_n^{(i-1)}$ is the enchanced point at iteration i−1 for point n, and $y_n$ is a noise point at point n.

* * * * *